US010036793B2

United States Patent
O'Brien et al.

(10) Patent No.: US 10,036,793 B2
(45) Date of Patent: Jul. 31, 2018

(54) METHOD AND APPARATUS FOR RECONSTRUCTING MAGNETIC RESONANCE IMAGES WITH PHASE NOISE-DEPENDENT SELECTION OF RAW DATA

(71) Applicant: Siemens Healthcare GmbH, Erlangen (DE)

(72) Inventors: Kieran O'Brien, High Gate Hill (AU); Viktor Vegh, Holland Park (AU)

(73) Assignee: Siemens Healthcare GmbH, Erlangen (DE)

( * ) Notice: Subject to any disclaimer, the term of this patent is extended or adjusted under 35 U.S.C. 154(b) by 275 days.

(21) Appl. No.: 15/147,146

(22) Filed: May 5, 2016

(65) Prior Publication Data

US 2016/0327624 A1    Nov. 10, 2016

Related U.S. Application Data (60) Provisional application No. 62/158,725, filed on May 8, 2015.

(51) Int. Cl.
*G01R 33/561* (2006.01)
*G01R 33/44* (2006.01)
(Continued)

(52) U.S. Cl.
CPC ....... *G01R 33/5608* (2013.01); *G01R 33/243* (2013.01); *G01R 33/44* (2013.01);
(Continued)

(58) Field of Classification Search
CPC ........ G01R 33/00; G01R 33/20; G01R 33/24; G01R 33/243; G01R 33/246; G01R 33/28;
(Continued)

(56) References Cited

U.S. PATENT DOCUMENTS

| 5,742,163 A | * | 4/1998 | Liu | ................... | G01R 33/56554 |
| | | | | | 324/307 |
| 6,566,878 B1 | * | 5/2003 | Komura | ........... | G01R 33/56563 |
| | | | | | 324/300 |

(Continued)

OTHER PUBLICATIONS

Dietrich et al, "Measurement of signal-to-noise ratios in MR images: Influence of multi-channel coils, parallel imaging, and reconstruction filters," Journal of Magnetic Resonance Imaging, vol. 26, No. 2, pp. 375-385 (2007).

(Continued)

*Primary Examiner* — Hoai-An D Nguyen
(74) *Attorney, Agent, or Firm* — Schiff Hardin LLP (57) ABSTRACT

In a method and magnetic resonance (MR) apparatus for producing an MR image of a subject, MR signals are acquired respectively with multiple MR signal reception channels, and with an ultra-high basic magnetic field in the MR data acquisition scanner. Each of the acquired MR signals has a phase and exhibiting phase noise, and the acquired MR signals from the multiple MR signal reception channels are entered into a computer, as raw data in which said phase noise is preserved. The computer calculates the respective phase noise of each MR signal reception channel relative to the phase noise in each other MR signal reception channel, and calculates a phase noise map from the relative phase noise calculation for each of said reception channels, the phase noise map representing a spatial distribution of phase noise over the multiple MR signal reception channels. The phase noise map is applied to said raw data and raw data are selected that, dependent on the phase noise map, have a phase noise that is below a predetermined threshold. MR image data are reconstructed only from the selected raw data.

8 Claims, 6 Drawing Sheets

(51) Int. Cl.
  G01R 33/56    (2006.01)
  G01R 33/24    (2006.01)
  G01R 33/54    (2006.01)
  G01R 33/3415  (2006.01)
(52) U.S. Cl.
  CPC .......... G01R 33/56 (2013.01); G01R 33/3415 (2013.01); G01R 33/543 (2013.01)
(58) Field of Classification Search
  CPC .. G01R 33/3415; G01R 33/38; G01R 33/387; G01R 33/3875; G01R 33/44; G01R 33/46; G01R 33/54; G01R 33/543; G01R 33/56; G01R 33/5608; G01R 33/56563; G01R 33/5659; A61B 5/055
  USPC ........................................ 324/300, 307, 309
  See application file for complete search history.

(56) References Cited

U.S. PATENT DOCUMENTS

| | | | | |
|---|---|---|---|---|
| 8,831,370 | B2* | 9/2014 | Archer | G02B 27/0025 324/300 |
| 9,645,215 | B2* | 5/2017 | Nickel | G01R 33/4828 |
| 2005/0162632 | A1* | 7/2005 | Taniguchi | G03B 27/72 355/69 |
| 2006/0052685 | A1* | 3/2006 | Cho | G01R 33/20 600/407 |
| 2010/0085102 | A1* | 4/2010 | Lee | G10L 19/008 327/334 |
| 2015/0009509 | A1* | 1/2015 | Kim | G01B 11/0691 356/503 |
| 2015/0355306 | A1* | 12/2015 | Stemmer | G01R 33/543 324/309 |

OTHER PUBLICATIONS

Bilgic et al., "MRI estimates of brain iron concentration in normal aging using quantitative susceptibility mapping," Neuroimage, vol. 59, Issue 3, pp. 2625-2635 (2011).

Duyn et al., "High-field MRI of brain cortical substructure based on signal phase," Proceedings of the National Academy of Sciences, vol. 104, No. 28, pp. 11796-11801 (2007).

Rudko et al., "Multiple Sclerosis: Improved Identification of Disease-relevant Changes in Gray and White Matter by Using Susceptibility-based MR Imaging," Radiology, vol. 272, No. 3, pp. 851-864 (2014).

Liu et al., "High-Field (9.4 T) MRI of Brain Dysmyelination by Quantitative Mapping of Magnetic Susceptibility," Neuroimage, vol. 56, No. 3, pp. 930-938 (2011).

Kim et al., "Simultaneous Imaging of In Vivo Conductivity and Susceptibility," Magnetic Resonance in Medicine, vol. 71, pp. 1144-1150 (2014).

Robinson et al., "Combining Phase images From Multi-Channel RF Coils Using 3D Phase Offset Maps Derived From a Dual-Echo Scan," Magnetic Resonance in Medicine, vol. 65, pp. 1638-1648 (2011).

Liu et al., "Morphology Enabled Dipole Inversion for Quantitative Susceptibility Mapping Using Structural Consistency Between the Magnitude Image and the Susceptibility Map," Neuroimage, vol. 59, No. 3, pp. 2560-2568 (2011).

Liu et al., "Inter-Echo Variance as a Weighting Factor for Multi-Channel Combination in Multi-Echo Acquisition for Local Frequency Shift Mapping," Magnetic Resonance in Medicine, vol. 73, pp. 1654-1661 (2015).

Chen et al., "Intracranial Calcifications and Hemorrhages: Characterization with Quantitative Susceptibility Mapping," Radiology, vol. 270, No. 2, pp. 496-505 (2014).

Li et al., "Quantitative Susceptibility Mapping of Human Brain Reflects Spatial Variation in Tissue Composition," Neuroimage, vol. 55, No. 4, pp. 1645-1656 (2011).

Liu et al., "Nonlinear Formulation of the Magnetic Field to Source Relationship for Robust Quantitative Susceptibility Mapping," Magnetic Resonance in Medicine, vol. 69, pp. 467-476 (2013).

Jellus et al., "Adaptive Coil Combination Using a Body Coil Scan as Phase Reference," Proc. Intl. Soc. Mag. Reson. Med., vol. 22, p. 4406 (2014).

Xu et al., "Flow Compensated Quantitative Susceptibility Mapping for Venous Oxygenation Imaging," Magnetic Resonance in Medicine, vol. 72, pp. 438-445 (2014).

Rauscher et al., "Automated Unwrapping of MR Phase Images Applied to BOLD MR-Venography at 3 Tesla," Journal of Magnetic Resonance Imaging, vol. 18, pp. 175-180 (2003).

Li et al., "Integrated Laplacian-based phase unwrapping and background phase removal for quantitative susceptibility mapping," NMR in Biomedicine, vol. 27, pp. 219-227 (2014).

Gudbjartsson et al., "The Rician Distribution of Noisy MRI Data," Magnetic Resonance in Medicine, vol. 34, No. 6, pp. 910-914 (1995).

Duyn et al., "Brain Anatomy with Phase," Susceptibility Weighted Imaging in MRI: Basic Concepts and Clinical Applications, pp. 121-136 (2011).

Lee et al., "The contribution of myelin to magnetic susceptibility-weighted contrasts in high-field MRI of the brain," Neuroimage, vol. 59, No. 4, pp. 3967-3975 (2012).

Bilgic et al., "Fast Quantitative Susceptibility Mapping with L1-Regularization and Automatic Parameter Selection," Magnetic Resonance in Medicine, vol. 72, pp. 1444-1459 (2014).

Walsh et al., "Adaptive Reconstruction of Phased Array MR Imagery," Magnetic Resonance in Medicine, vol. 43, pp. 682-690 (2000).

Deistung et al. "Toward in vivo histology: A comparison of Quantitative Susceptibility Mapping (QSM) with Magnitude-, Phase-, and R*2-Imaging at Ultra-High Magnetic Field Strength"; NeuroImage; vol. 65; pp. 299-314; (2013).

* cited by examiner

FIG. 6

METHOD AND APPARATUS FOR RECONSTRUCTING MAGNETIC RESONANCE IMAGES WITH PHASE NOISE-DEPENDENT SELECTION OF RAW DATA

BACKGROUND OF THE INVENTION

RELATED APPLICATION

The present application claims the benefit of the filing date of May 8, 2015 of provisional application 62/158,725, the content of which is incorporated herein by reference.

FIELD OF THE INVENTION

The present invention concerns magnetic resonance imaging, and in particular magnetic imaging using an ultra-high basic magnetic field.

DESCRIPTION OF THE PRIOR ART

In the Gradient Recalled Echo (GRE) regime of Magnetic Resonance Imaging (MRI) signal magnitude and phase can be acquired routinely. It has been established that grey-white matter contrast can be increased as much as 10-fold using ultra-high field MR scanners and by mapping signal phase instead of signal magnitude (Duyn et al., "High-field MRI of brain cortical substructure based on signal phase," Proceedings of the National Academy of Sciences 104, p.11796 (2007)). Ultra-high field scanners are understood in MRI technology as meaning scanners that operate with a basic magnetic field of more than 3 T, with the latest developed scanners operating at 7 T and higher. GRE-MRI signal phase converted to frequency shift maps can reveal important information about disease progression, for example in brain studies relating to multiple sclerosis Spatial variations in signal phase contain information on local magnetic field changes affecting the reference (basic magnetic) field ($B_0$), which can subsequently be resolved as spatially varying magnetic susceptibility constituents by solving the inverse problem, the subject of Quantitative Susceptibility Mapping (QSM) (Bilgic et al., "MRI estimates of brain iron a concentration in b normal aging using quantitative susceptibility mapping," Neuroimage 59 pp. 2625-2635 (2012), Li et al., "Quantitative susceptibility mapping of human brain reflects spatial variation in tissue composition" Neuroimage 55: pp. 1645-1656 (2011), Deistung et al., "Toward in vivo histology: A comparison of Quantitative Susceptibility Mapping (QSM) with Magnitude-, Phase-, and $R_2^*$-Imaging at Ultra-High Magnetic Field Strength," Neuroimage 65, pp. 299-314 (2013). More recently, it was shown that sample conductivity can also be reconstructed using extrapolation of the GRE-MRI signal phase (Kim et al., "Simultaneous imaging of in vivo conductivity and susceptibility," Magnetic Resonance in Medicine Vol. 71, pp. 1144-1150 (2014)). These important advances demonstrate increasing utility for phase-based methods, and their impact should increase with improvements in combined images of signal phase.

The use of phased array coils in MRI provides the advantage of increased sensitivity and this can be increased by increasing the number of coil elements. Each element results in a single channel of data, which need to be combined to form a single image. The noise in each channel of data follows certain characteristics, and this is different depending on whether signal magnitude or phase is considered. Although magnetic resonance image noise has been explored widely, the noise in individual channels has not been the recent attention of researchers. Based on the assumption that noise in the real and imaginary channel of the acquired signal follows a Gaussian distribution, Gudbjartsson et al. provided expressions for the noise in magnitude and phase images (Gudbjartsson et al., "The Rician distribution of noisy MRI data," Magnetic Resonance in Medicine Vol. 34, pp. 910-914 (1995)). The noise in signal magnitude at sample locations is described by the Rician distribution and in the absence of sample signal it is derived using the Rayleigh distribution. Noise in the phase image, however, deviates from the Gaussian distribution with decreasing signal-to-noise ratio.

Current methods used for combining individual coil data into magnitude and phase images, in one form or another, consider regions of high and low signal-to-noise ratios of the image and use this as criteria for obtaining combined images (Walsh et al., "Adaptive reconstruction of phased array MR imagery," Magnetic Resonance in Medicine Vol. 43 pp.682-690 (2000), Dietrich et al., "Measurement of signal-to-noise ratios in MR images: Influence of multichannel coils, parallel imaging, and reconstruction filters," Journal of Magnetic Resonance Imaging Vol. 26 pp.375-385 (2007), Robinson et al., "Combining phase images from multi-channel RF coils using 3D phase offset maps derived from a dual-echo scan," Magnetic Resonance in Medicine Vol. 65 pp.1638-1648 (2011), Jellus et al., "Adaptive Coil Combination Using a Body Coil Scan as Phase Reference," International Symposium on Magnetic Resonance in Medicine, Milan, Italy p 4406 (2014) Liu et al., "Inter-echo variance as a weighting factor for multi-channel combination in multi-echo acquisition for local frequency shift mapping," Magnetic Resonance in Medicine Vol. 73, pp/1654-1661 (2015)). Essentially, phase combination is achieved adaptively by weighting of individual channel information. Due to the decaying nature of the magnitude signal with distance from a particular coil of interest and the Rician characteristics of noise, a sum-of-squares approach for the signal magnitude leads to images of high signal-to-noise ratios, as described in the aforementioned article by Gudbjartsson et al. However, this is not the case for the signal phase, as has been recognized in the aforementioned articles by Walsh et al. and Jellus et al. The signal phase does not have the property that it decays with distance away from the coil, nor does the noise in signal phase follow a specific distribution across all signal-to-noise ratios. In fact, it has been shown analytically that signal phase can be averaged where signal-to-noise ratio is high, and should not be averaged where this ratio is low (Lathi, "Modern Digital and Analog Communication Systems" Oxford University Press (1998)).

SUMMARY OF THE INVENTION

In view of the above observations, the present invention proceeds from the insight that noise in signal phase does not necessarily align with regions of high signal-to-noise ratio in images and care must be taken in the choice of the method for combining signal phase from multiple channel data.

Based on this insight, in a method and a magnetic resonance (MR) apparatus in accordance with the invention for producing an MR image of a subject, MR signals are acquired respectively with multiple MR signal reception channels, and with an ultra-high basic magnetic field in the MR data acquisition scanner. Each of the acquired MR signals has a phase and exhibiting phase noise, and the acquired MR signals from the multiple MR signal reception channels are entered into a computer, as raw data in which said phase noise is preserved. The computer calculates the respective phase noise of each MR signal reception channel relative to the phase noise in each other MR signal reception channel, and calculates a phase noise map from the relative phase noise calculation for each of said reception channels, the phase noise map representing a spatial distribution of phase noise over the multiple MR signal reception channels. The phase noise map is applied to said raw data and raw data are selected that, dependent on the phase noise map, have a phase noise that is below a predetermined threshold. MR image data are reconstructed only from the selected raw data.

The reconstructed image data are made available from the computer as an output in electronic form, such as in the form of a data file.

DESCRIPTION OF THE PREFERRED
EMBODIMENTS APPARATUS DESCRIPTION

Figure 1:
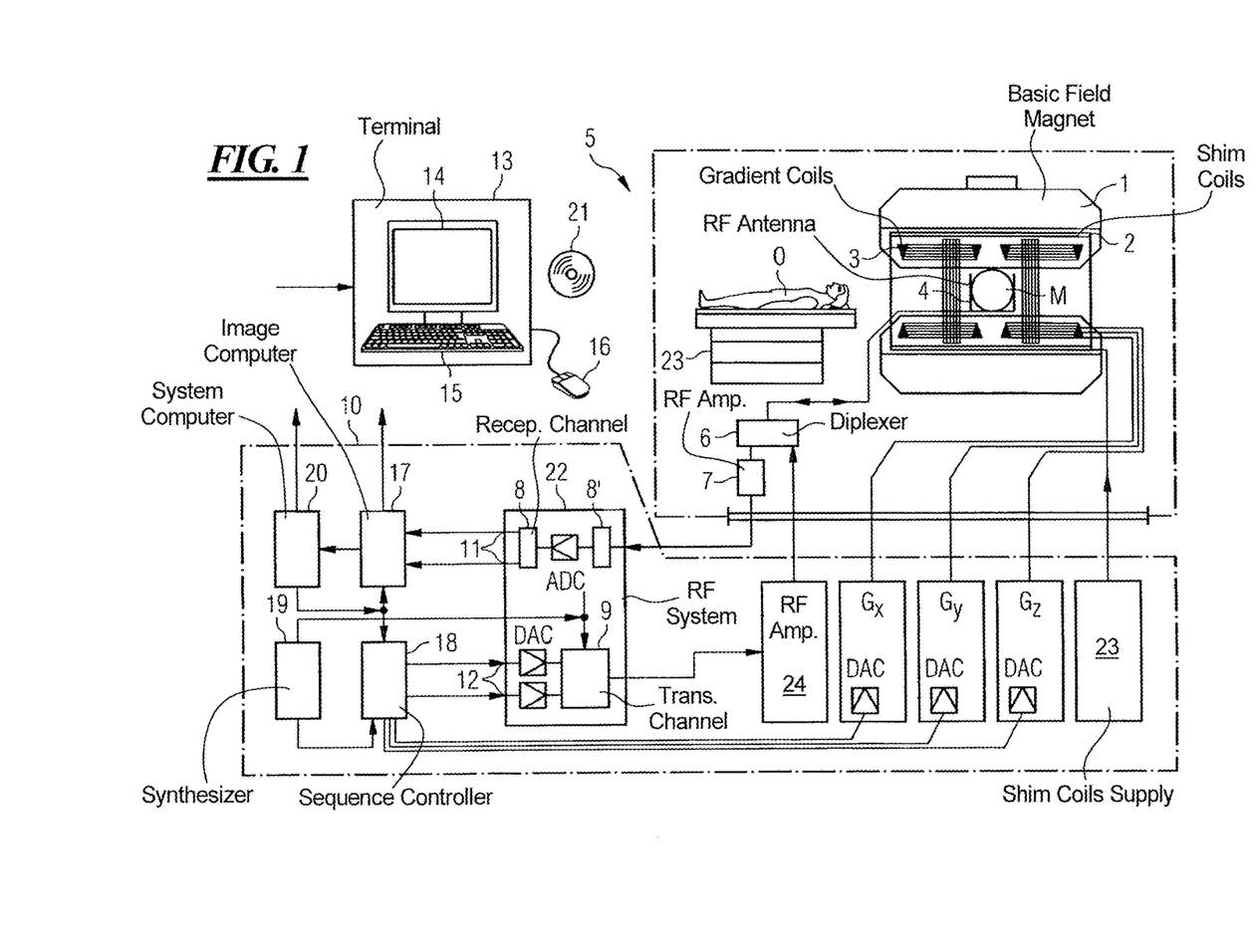
FIG. 1 schematically illustrates a magnetic resonance imaging apparatus constructed and operated in accordance with the present invention.

FIG. 1 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate supply 27 for the shim-coils 2.

A cylindrically shaped gradient coil system 3 is incorporated in the basic field magnet 1, composed of three windings. Each winding is supplied by a corresponding amplifier 24-26 with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier into a magnetic alternating field for the excitation of the nuclei by tipping ("flipping") the spins in the subject or the region thereof to be examined, from the alignment produced by the basic magnetic field. The radio-frequency antenna 4 is shown schematically as a whole body coil and serves as an RF transmitting coil. One or more local coils 28 are schematically shown which serve as RF receiving coils in the form of an annular, linear or matrix type configuration of coils, each receiving coil forming a respective one of multiple RF reception channels. It is also possible for the local coils 28 to serve as transmitting coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

The Noise Behind Coil Combination

The following provides analytic expressions for the noise in signal magnitude and phase and outline criteria that allow certain assumptions to be made about the distributions. It is assumed that MRI data take complex form having real and imaginary parts both of which contain Gaussian noise with variance $\sigma^2$. Also, M denotes the measured signal magnitude including noise and A is the signal in the absence of noise.

Signal Magnitude

The probability distribution function of M has been shown to have the following form, from the aforementioned Lahti textbook:

$$P_M(M) = \frac{M}{\sigma^2} e^{-(M^2+A^2)/2\sigma^2} I_0\left(\frac{A \times M}{\sigma^2}\right),$$

where $I_0$ is the zeroth order Bessel function of the first kind. A number of observations have been made about the nature of $P_M$. In particular, for ratios of $A/\sigma<1$ the distribution is far from Gaussian. For $A/\sigma \approx 3$ and above, $P_M$ increasingly approximates the Gaussian distribution. It does not follow that the mean of the measured signal ($\overline{M}$) over coils can be interchanged for A, as it will be biased due to the non-linear transformation involved in image formation. Instead, because the signal magnitude attenuates with distance away from each coil, a coil's contribution to the signal of distant regions may be small compared to other coils which may have a higher signal-to-noise ratio. For this reason, weighted averaging or sum of squares of signal magnitude has been adequate as methods of combining data acquired across multiple channels.

Signal Phase

Signal phase ($\phi$) is obtained by computing the arctangent of the imaginary divided by the real signal components in a voxel-by-voxel manner. The values of $\phi$ map between $-\pi$ and $\pi$. The probability distribution function of the variation in signal phase with respect to the mean phase is given by from the aforementioned Lahti textbook:

$$P_{\Delta\phi}(\Delta\phi) = \frac{1}{2\pi} e^{-A^2/2\sigma^2}\left[1 + \frac{A}{\sigma}\sqrt{2\pi} \cos\Delta\phi e^{A^2\cos^2\Delta\phi/2\sigma^2} \times \frac{1}{2\sqrt{\pi}} \int_{-\infty}^{\frac{A\cos\Delta\phi}{\sigma}} e^{-x^2/2} dx\right],$$

where $\Delta\phi = \phi - \overline{\phi}$. In regions of large signal-to-noise ratios (i.e. locations where $A \gg \sigma$), the integral term is approximately unity, and the expression reduces to:

$$P_{\Delta\phi}(\Delta\phi) \approx \frac{1}{\sqrt{2\pi(\sigma/A)^2}} e^{\frac{-\Delta\phi^2}{2(\sigma/A)^2}},$$

which is in the form of a zero mean Gaussian distribution. Hence, the motivation to combine phase images where signal-to-noise ratios are large is not misguided since the expectation is that in these regions noise should reduce through averaging.

Simulation

Simulations of noisy data were performed to illustrate the Gaussian nature of the response with respect to SNR. These simulations were based on the formulation below of the complex signal provided in the aforementioned textbook by Lathi, wherein |S| is the signal magnitude and ∠S is the signal phase:

$$|S| = \sqrt{(SNR \times \sigma + \eta_c)^2 + \eta_s^2},$$

$$\angle S = \tan^{-1}\left(\frac{\eta_s}{SNR \times \sigma + \eta_c}\right),$$

wherein $\sigma = \sqrt{2 \times N \times B}$. The bandwidth was set to 10 kHz and the amplitude was set to 0.5. In the above formulation $\eta_c$ and $\eta_s$ correspond to noise and their values are drawn from a zero mean $\sigma$ standard deviation Gaussian distribution.

Simulated were 10,000 instances of voxel signal and phase for each SNR choice of 0.5, 1, 3.5 and 10. The results were analyzed by plotting histograms across 20 bins. The PDF of the signal phase also was plotted across SNRs of 0.5 to 20.5 in increments of 1 to assess differences between adaptive combine and selective combine of signal phase across channels. For illustration purposes only, simulation results were resealed to fit in the range (0, 1). Algorithms were implemented in MATLAB version 2013b.

7 T Human Data

In this evaluation, 32 channel gradient recalled echo 2D MRI data with an in plane resolution of 750 microns$^2$ were acquired using a human whole body 7 T Siemens Magnetom research scanner. The following acquisition parameters were set: TE=20.4 ms, TR=765 ms, bandwidth=257 Hz/voxel, field-of-view=224 by 154 mm$^2$, slices=30 with 750 micron slice thickness, partial Fourier=75% and iPAT=2. Raw magnitude and phase images were reconstructed for each channel and data were saved in MATLAB (Mathworks, R2014) native format using a windows workstation with 12 cores and 64 GB of RAM. Background phase was removed using a homodyne filter with ¼ window size with respect to the matrix size, according to Rauscher et al., "Automated unwrapping of MR phase images applied to BOLD MR-venography at 3 Tesla" Journal of Magnetic resonance imaging Vol. 18 pp.175-180 (2003).

Phase Combine

The following outlines the inventive approach of selectively combining signal phase acquired across multiple channels. In the case of N channels of data wherein, for each channel, a magnitude and phase image exists, with the background phase removed, the complex image (I) can be reconstructed:

$$I_n(x,y,z) = M_n(x,y,z)e^{i\phi_n(x,y,z)}, n=1, ..., N,$$

given M and φ are the signal magnitude and phase in the corresponding images at location (x, y, z). It can be observed that:

$$I_n \bar{I}_n = M_n^2, I_n \bar{I}_m = M_n M_m e^{i\varepsilon_{n,m}}, \forall n \neq m,$$

where $\bar{I}$ is the conjugate of I and $\varepsilon_{n,m}$ is a residual term due to noise in signal phase computed between coils n and m. The residual error phase error with respect to any of the coils can be computed as:

$$e^{i\varepsilon_{n,m}} = \frac{I_n \bar{I}_m}{M_n M_m} = e^{i(\phi_n - \phi_m)}.$$

Maps of $\varepsilon_{n,m}$ were then reconstructed by conjugating individual channel complex image data for all channel combinations. That is, for any two different channels m and n, $\varepsilon_{n,m}$ was computed, wherein $I_m$ and $I_n$ are complex valued. The standard deviation of the spatial variation in $\varepsilon_{n,m}$ was computed by applying a moving window of size 3×3 voxels across the entire range of $\varepsilon_{m,n}$.

Figure 2:
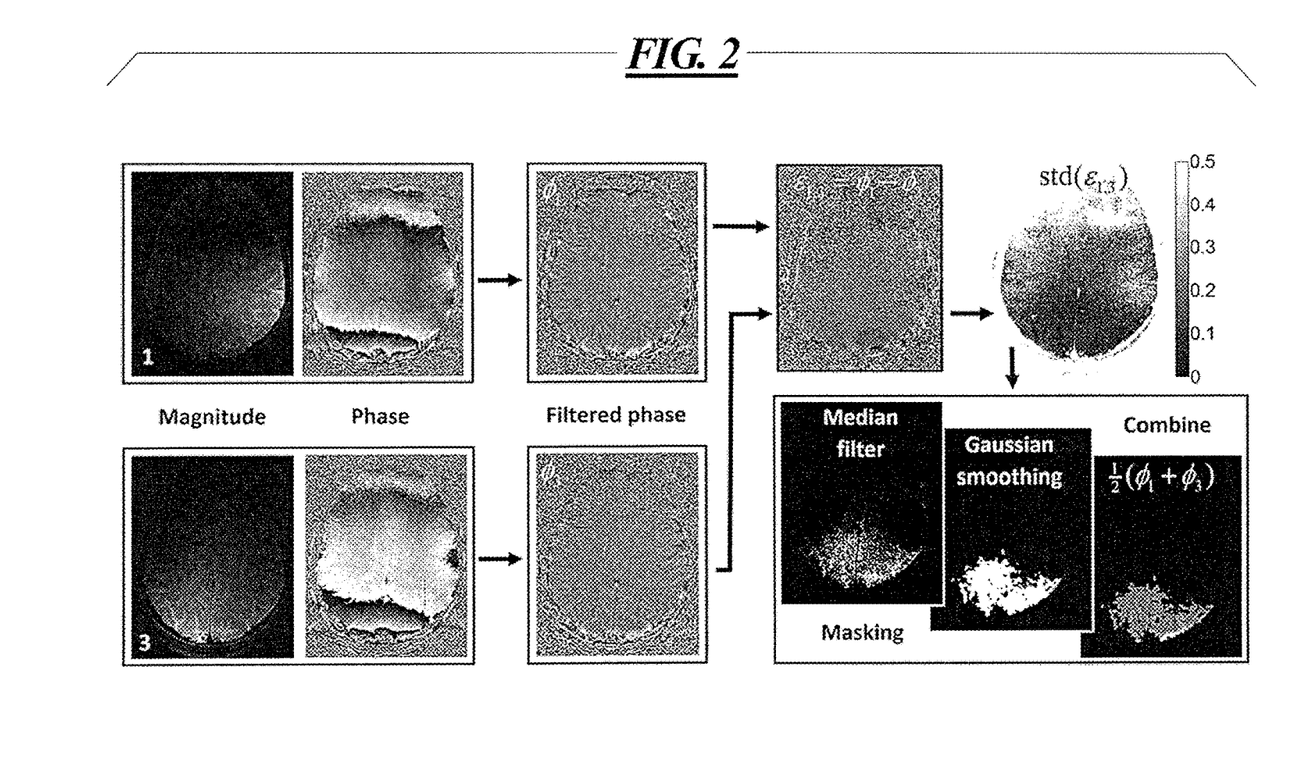
FIG. 2 illustrates the basic steps involved in determining the region to be used to combine data from two individual panels, in accordance with the present invention.

FIG. 2 illustrates the steps involved in determining the region to be used to combine data from two individual channels. The process illustrates our approach of creating masks based on two phase images. Notably, the emphasis of our work is to selectively choose regions where phase images for two channels should be combined. This selective process can then be repeated for all channel combinations to cover the entire brain by averaging all two channel results.

In FIG. 2 an example map, $\varepsilon_{1,3}$, is provided. The corresponding std($\varepsilon_{1,3}$) denoting the standard deviation of $\varepsilon_{1,3}$, is shown over the range [0, 0.5]. Notably, the distribution of values depends on the noise in individual phase images, which is a function of the acquisition parameters and the system used to acquire data. We empirically tested different window sizes used to calculate std($\varepsilon_{1,3}$), and found that a window size of 3×3 performed comparably to larger window sizes.

Results

Figure 3:
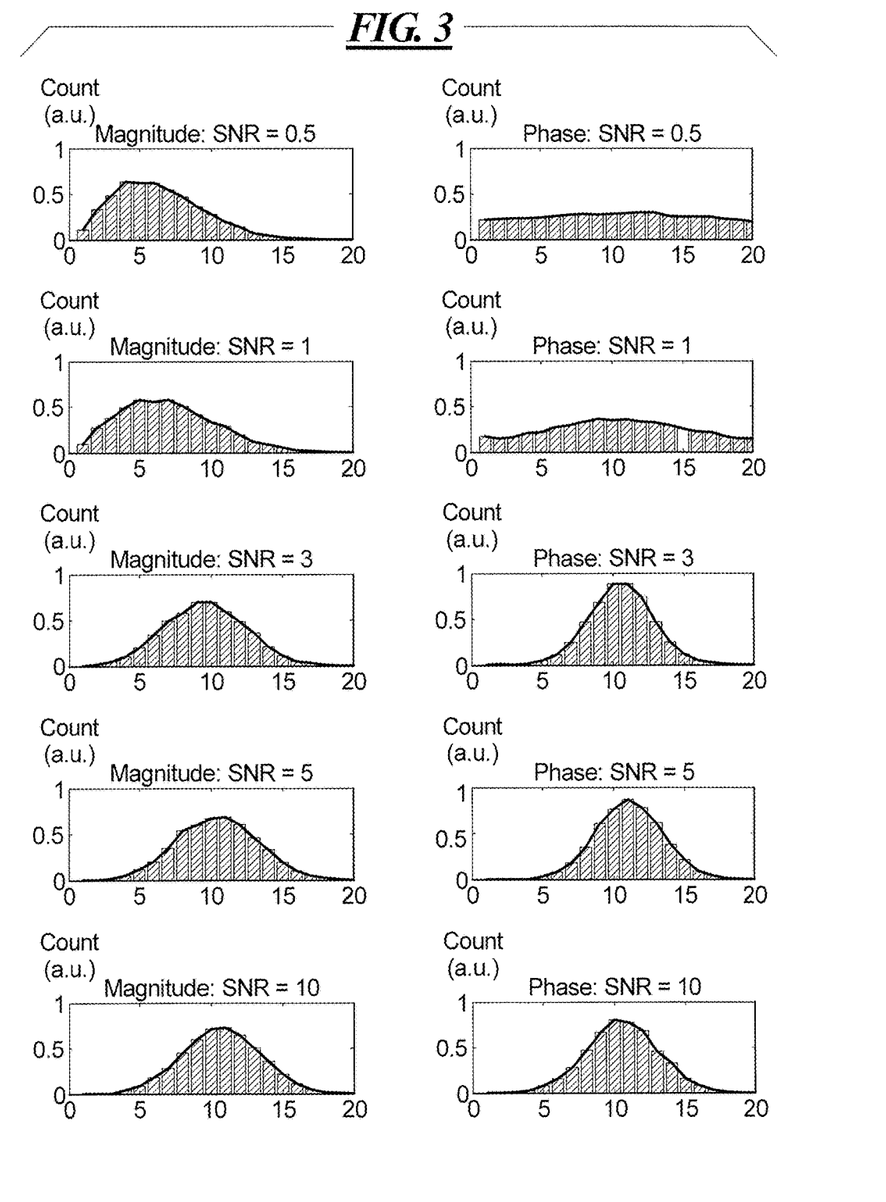
FIG. 3 shows the distributions of signal magnitude and phase in the presence of noise for a single reception channel of a magnetic resonance data acquisition scanner.
Figure 4A:
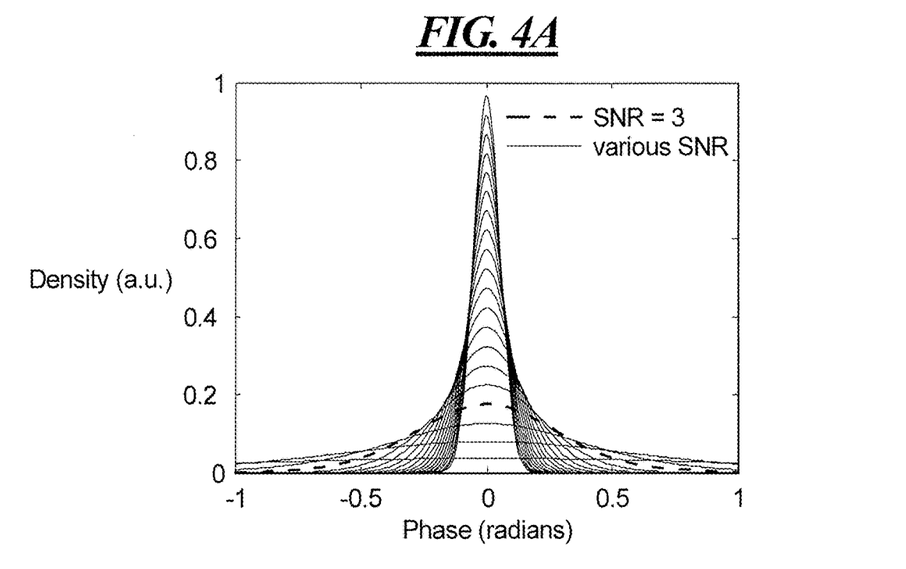
FIG. 4A shows plots of signal-to-noise ratios (SNRs) of 0.5 to 20 (solid lines from low amplitude to high amplitude) with the PDF when SNR=3 shown as a dashed line.
Figure 4B:
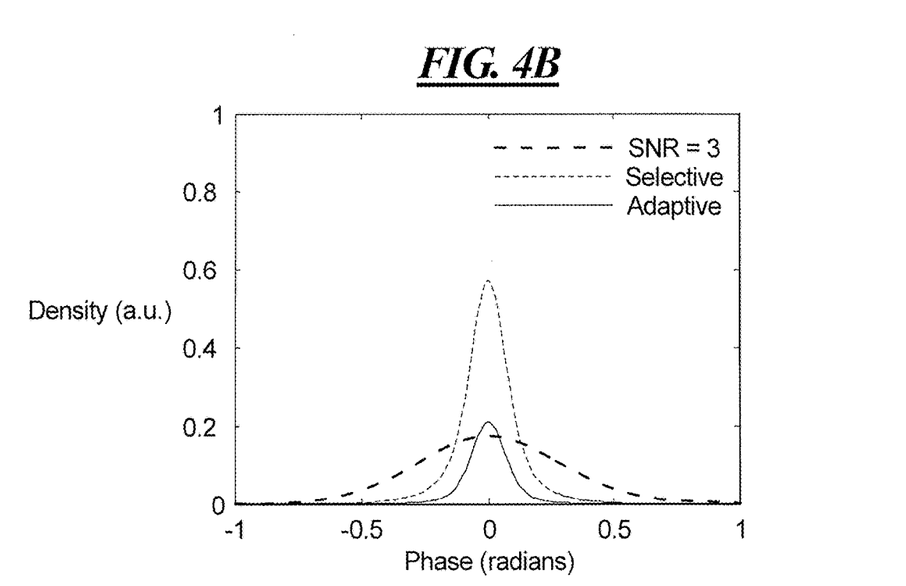
FIG. 4B shows probability density function plots wherein the dashed line again depicts SNR=3, and the solid lines shown the adaptably combined result in accordance with the invention.

FIG. 3 shows the results for both signal magnitude and phase generated using the simulation environment. FIG. 3 confirms previous observations that SNR should be 3 or larger to achieve a Gaussian-like response. In this regime the noise characteristics are such that data averaging can be used to reduce the noise in the result. The characteristics of the distributions between signal magnitude and phase are different: a skewed trend in the distribution for the signal magnitude presents with decreasing SNR, while signal phase flattens with decreasing SNR. Both cases can introduce a trend in the data when low-SNR data are potentially used. FIGS. 4A and 4B show the effect of combining multiple channel data for the case of signal phase. The dashed line in FIG. 4A (and in FIG. 4B) depicts the SNR=3 level, below which thin lines depict lower SNR responses down to 0.5, and above responses are between SNRs of 3.5 and 20.5. Two types of data combinations were performed.

First, the individual data were weighted by the SNR of that data and summed across all data. This resulted in the continuous line in FIG. 4B, showing Gaussian-like behavior with relatively low SNR when compared to the SNR=3 response. Second, various SNR responses were combined by only averaging SNR>3 data and the result is the lighter dashed line in FIG. 4B. It is thereby evident that selective combine can produce a signal phase response with significantly larger power (i.e. the area under the selective combine curve is 3.15 times larger than the adaptive combine area). A primary goal is to be able to identify regions in individual channel data corresponding to low and high SNR. A secondary goal is to use a SNR cut-off resulting in a combined image without missing parts, which may be introduced when the SNR cut-off is too high and no channel was able to capture the required image quality.

Figure 5:
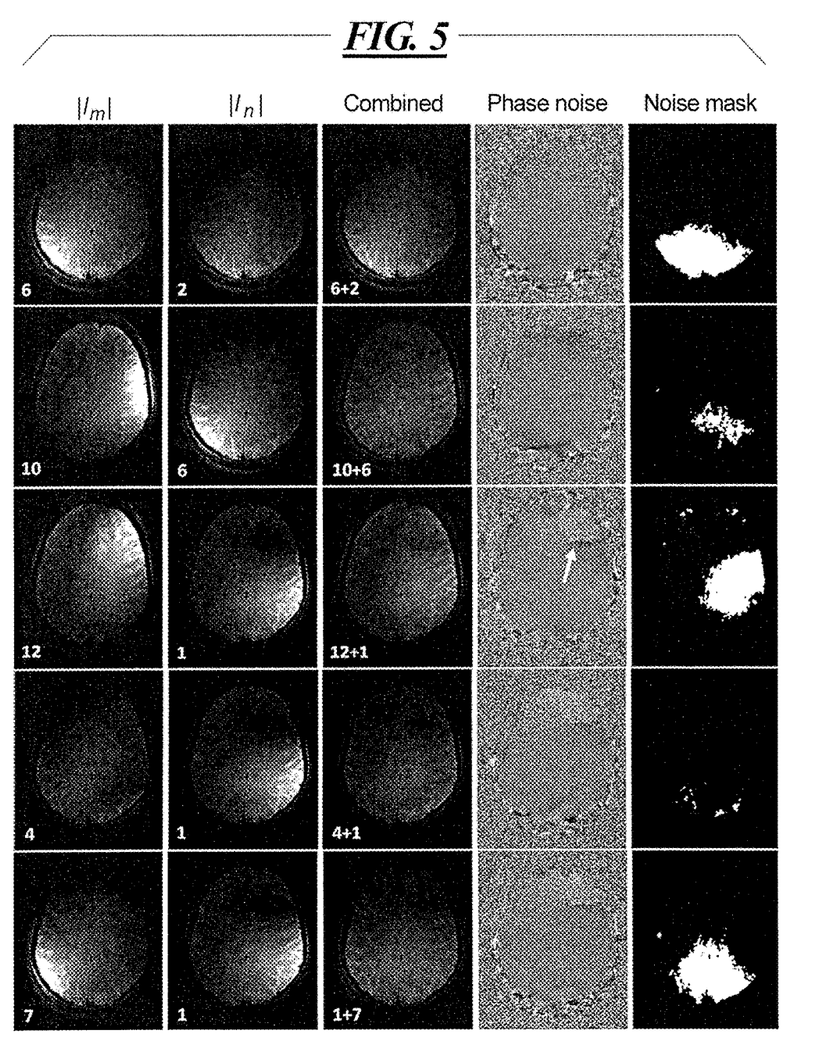
FIG. 5 shows examples of images obtained with various coil combinations for explaining the invention.

FIG. 5 shows results of four different channel combinations. The rows in FIG. 5 respectively correspond to different channel combinations, with the numbers in the bottom left corner of each magnitude image designating the channel number for the image. The symbol+designates the sum-of-squares combined magnitude images. The signal phase noise maps capture the spatial distribution of noise. At the far right, the binary mask used to combine the phase images is shown.

The magnitude images are used to illustrate regions of high to low signal-to-noise ratio in individual channel data. The maps of the combined magnitude image illustrate improvements in image quality due to improvements in signal-to-noise ratio. From the phase noise images, the mask was derived illustrating the regions where channel data were combined. Four examples of combining channels n and m are illustrated row-by-row. The combination of channels 6 and 2 (top row) lead to the classical outcome wherein regions of high signal-to-noise ratio are expected, to be used in the phase combine. For channels 12 and 1 (third row), however, the spatial variation maps show, at the location of the arrow, that even though a high signal-to-noise ratio is expected in this area, the noise in the phase is very high. The mask shows that information from this region was not used to combine individual phase from these two channels. Furthermore, the combination of channels 1 and 4 (fourth row) shows that not all regions with high signal-to-noise ratio regions provide information that is useful in combining phase data.

Figure 6:
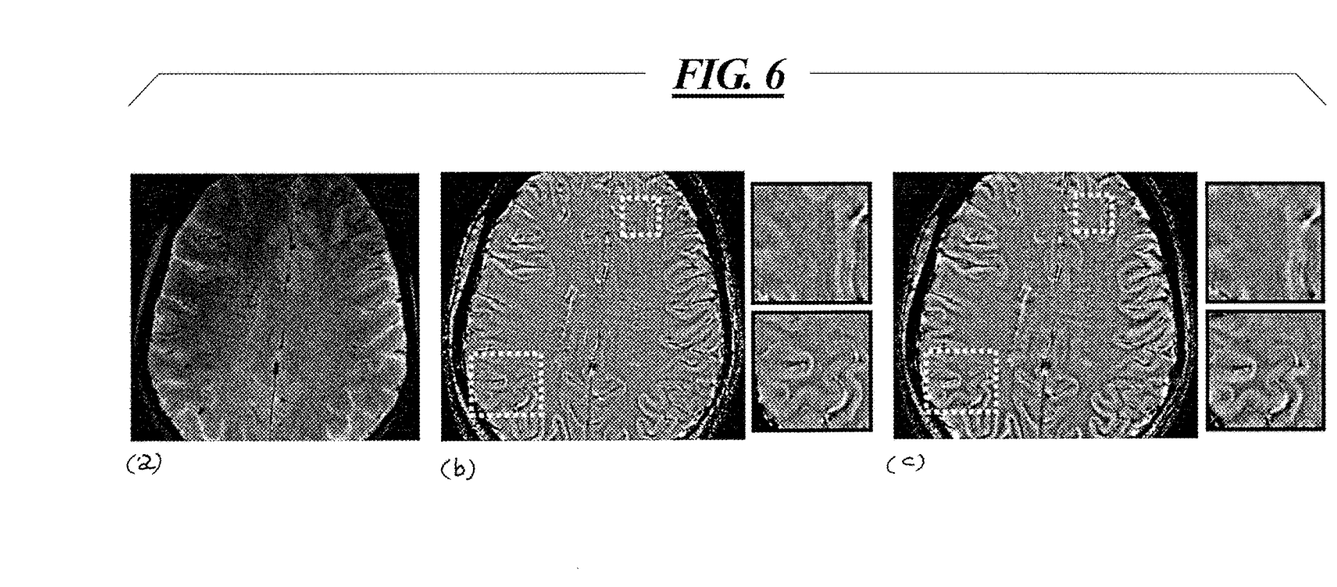
FIG. 6 in (a) shows the sum-of-squares combined magnitude image, in (b) shows an adaptive combined phase image, and in (c) shows a selective combined phase image, with the insets at (b) and (c) showing the marked qualitative difference in signal-to-noise ratio between the two combined phase images.

FIG. 6 shows results for the sum-of-squares magnitude image, adaptive combine phase image and selective combine phase image (based on combining regions using a mask derived from $E_{n,m}$). The marked improvement in the phase image using selective phase combine is evident in comparison to adaptive phase combine. The insets of FIG. 6 compare two regions and qualitatively illustrate the marked improvement in signal to noise ratio. Importantly, these results indicate that by selectively combining phase images, not only the noise can be reduced in the combined phase image, but there appears to be an improvement in phase contrast as well.

Recently, multiple echo time GRE-MRI data was used to compute frequency shift and susceptibility maps at various echo times (Lee et al., "The contribution of myelin to magnetic susceptibility-weighted contrasts in high-field MRI of the brain," Neuroimage 59 pp. 3967-3975 (2011), the aforementioned article by Liu et al., and Rudko et al., "Multiple Sclerosis: Improved Identification of Disease-relevant Changes in Gray and White Matter Using Susceptibility-based MR Imaging," Radiology 272(3) pp.851-864 (2014)). This information can then be used to average the maps, as these maps are time invariant. The reason for averaging maps across echo times has to do with the phase wraps occur in the raw phase images. Short echo time imaging, wherein phase wraps are reduced, do not provide sufficient phase information to be able to compute frequency shift and quantitative susceptibility maps. So generally, the signal is allowed to dephase more and more by increasing the echo time at the expense of more frequent phase wraps presenting at different spatial locations. Unwrapping algorithms can struggle to correct phase wraps in the presence of noise, as it can be difficult to distinguish in the presence of noise which phases are wrapped and which are correct. Thus, averaging across multiple echo times helps reduce artefacts due to processing errors introduced by noise. However, with improved computation of combined phase images, the necessity to perform such steps is reduced, if not eliminated. This results in improved quality of combined phase images, which are likely to benefit the end goal of producing reliable and accurate frequency shift and qualitative susceptibility maps.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for producing a magnetic resonance (MR) image of a subject, comprising:

operating an MR data acquisition scanner, comprising a plurality of MR signal reception channels and a basic field magnet, to acquire MR signals from a subject respectively with said plurality of MR signal reception channels, while the subject is situated in the MR data acquisition scanner, and with said basic field magnet operated to produce an ultra-high basic magnetic field in said MR data acquisition scanner, each of the acquired MR signals having a phase and exhibiting phase noise;

entering the acquired MR signals from said plurality of MR signal reception channels into a computer, as raw data in which said phase noise is preserved and, in said computer, calculating the respective phase noise of each MR signal reception channel relative to the phase noise of each other MR signal reception channel in said plurality of MR signal reception channels;

in said computer, calculating a phase noise map from the relative phase noise calculation for each of said MR signal reception channels, said phase noise map representing a spatial distribution of phase noise over said plurality of MR signal reception channels;

in said computer, applying said phase noise map to said raw data and selecting raw data that, dependent on said phase noise map, have a phase noise that is below a predetermined threshold; and in said computer, executing a reconstruction algorithm to reconstruct MR image data from only said selected raw data, and making the MR image data available in electronic form from the computer as a data file.

2. A method as claimed in claim 1 comprising operating said basic field magnet of said MR data acquisition scanner to produce said ultra-high basic magnetic field with a field strength of more than 3 Tesla.

3. A method as claimed in claim 1 comprising operating said basic field magnet of said MR data acquisition scanner to produce said ultra-high basic magnetic field with a field strength of at least 7 Tesla.

4. A method as claimed in claim 1 comprising selecting raw data dependent on said phase noise map by selecting raw data representing regions within said phase noise map having a signal-to-noise ratio that is greater than 3.

5. An apparatus for producing a magnetic resonance (MR) image of a subject, comprising:

an MR data acquisition scanner comprising a plurality of MR signal reception channels and a basic field magnet;

a computer configured to operate said MR data acquisition scanner to acquire MR signals from a subject respectively with said plurality of MR signal reception channels, while the subject is situated in the MR data acquisition scanner, and with said basic field magnet operated to produce an ultra-high basic magnetic field in said MR data acquisition scanner, each of the acquired MR signals having a phase and exhibiting phase noise;

a memory accessible by said computer;

said computer being configured to enter the acquired MR signals from said plurality of MR signal reception channels into said memory, as raw data in which said phase noise is preserved, and said computer being configured to calculate, from said raw data, the respective phase noise of each MR signal reception channel relative to the phase noise of each other MR signal reception channel in said plurality of MR signal reception channels;

said computer being configured to calculate a phase noise map from the relative phase noise calculation for each of said MR signal reception channels, said phase noise map representing a spatial distribution of phase noise over said plurality of MR signal reception channels;

said computer being configured to apply said phase noise map to said raw data and to select raw data that, dependent on said phase noise map, have a phase noise that is below a predetermined threshold; and said computer being configured to execute a reconstruction algorithm to reconstruct MR image data from only said selected raw data, and to make the MR image data available in electronic form from the computer as a data file.

6. An apparatus as claimed in claim 5 wherein said computer is configured to operate said basic field magnet of said MR data acquisition scanner to produce said ultra-high basic magnetic field with a field strength of more than 3 Tesla.

7. An apparatus as claimed in claim 5 wherein said computer is configured to operate said basic field magnet of said MR data acquisition scanner to produce said ultra-high basic magnetic field with a field strength of at least 7 Tesla.

8. An apparatus as claimed in claim 5 wherein said computer is configured to select raw data dependent on said phase noise map by selecting raw data representing regions within said phase noise map having a signal-to-noise ratio that is greater than 3.

* * * * *